United States Patent
Shah et al.

(10) Patent No.: US 10,902,967 B2
(45) Date of Patent: Jan. 26, 2021

(54) PRINTED CIRCUIT SURFACE FINISH, METHOD OF USE, AND ASSEMBLIES MADE THEREFROM

(71) Applicant: LILOTREE, L.L.C., Redmond, WA (US)

(72) Inventors: Kunal Shah, Bothell, WA (US); Purvi Shah, Bothell, WA (US)

( * ) Notice: Subject to any disclaimer, the term of this patent is extended or adjusted under 35 U.S.C. 154(b) by 0 days.

(21) Appl. No.: 16/688,995

(22) Filed: Nov. 19, 2019

(65) Prior Publication Data

US 2020/0090829 A1  Mar. 19, 2020

Related U.S. Application Data

(63) Continuation of application No. 16/068,247, filed as application No. PCT/US2017/012777 on Jan. 9, 2017, now Pat. No. 10,566,103.

(Continued)

(51) Int. Cl.
*H01B 1/02* (2006.01)
*H05K 3/24* (2006.01)
(Continued)

(52) U.S. Cl.
CPC .............. *H01B 1/023* (2013.01); *H01B 1/02* (2013.01); *H01B 1/026* (2013.01); *H01L 23/498* (2013.01);
(Continued)

(58) Field of Classification Search
CPC ..... H05K 2201/0344; H05K 2203/072; H05K 1/09; H05K 3/244; H05K 3/282;
(Continued)

(56) References Cited

U.S. PATENT DOCUMENTS

| 4,400,415 A | 8/1983 | Kessler et al. |
| 6,358,630 B1 | 3/2002 | Tsukada et al. |

(Continued)

FOREIGN PATENT DOCUMENTS

| JP | 2004176179 | | 6/2004 | |
| KR | 20140082442 A | * | 7/2014 | ............. H01L 23/12 |

OTHER PUBLICATIONS

U.S. Appl. No. 16/068,247, "Non-Final Office Action", dated Oct. 17, 2019, 9 pages.

(Continued)

*Primary Examiner* — Tri V Nguyen
(74) *Attorney, Agent, or Firm* — Kilpatrick Townsend & Stockton LLP

(57) ABSTRACT

A surface finish for a printed circuit board (PCB) and semiconductor wafer includes a nickel disposed over an aluminum or copper conductive metal surface. A barrier layer including all or fractions of a nitrogen-containing molecule is deposited on the surface of the nickel layer to make a barrier layer/electroless nickel (BLEN) surface finish. The barrier layer allows solder to be reflowed over the surface finish. Optionally, gold (e.g., immersion gold) may be coated over the barrier layer to create a nickel/barrier layer/gold (NBG) surface treatment. Presence of the barrier layer causes the surface treatment to be smoother than a conventional electroless nickel/immersion gold (ENIG) surface finish. Presence of the barrier layer causes a subsequently applied solder joint to be stronger and less subject to brittle failure than conventional ENIG.

13 Claims, 15 Drawing Sheets

Related U.S. Application Data

(60) Provisional application No. 62/276,485, filed on Jan. 8, 2016.

(51) Int. Cl.
*H05K 1/09* (2006.01)
*H01L 23/498* (2006.01)
*H05K 3/28* (2006.01)
*H05K 3/34* (2006.01)
*H05K 3/18* (2006.01)
*H05K 1/11* (2006.01)
*H01L 23/00* (2006.01)
*H05K 1/18* (2006.01)

(52) U.S. Cl.
CPC ......... *H01L 23/49866* (2013.01); *H05K 1/09* (2013.01); *H05K 3/24* (2013.01); *H05K 3/244* (2013.01); *H05K 3/282* (2013.01); *H01L 24/03* (2013.01); *H01L 24/05* (2013.01); *H01L 2224/0346* (2013.01); *H01L 2224/05155* (2013.01); *H01L 2224/05644* (2013.01); *H05K 1/111* (2013.01); *H05K 1/181* (2013.01); *H05K 3/184* (2013.01); *H05K 3/341* (2013.01); *H05K 2201/0344* (2013.01); *H05K 2201/0347* (2013.01); *H05K 2203/072* (2013.01); *H05K 2203/0793* (2013.01); *H05K 2203/122* (2013.01)

(58) Field of Classification Search
CPC .... H05K 3/24; H05K 3/184; H05K 2203/122; H01L 2224/0346; H01B 1/02
USPC .................. 252/502, 510; 174/251; 438/758
See application file for complete search history.

(56) References Cited

U.S. PATENT DOCUMENTS

| | | |
|---|---|---|
| 2004/0041393 A1 | 3/2004 | Lee |
| 2004/0231141 A1* | 11/2004 | Nishinaka .............. H05K 3/108 29/609 |
| 2005/0186772 A1 | 8/2005 | Brintzinger et al. |
| 2010/0151263 A1* | 6/2010 | Abys ....................... C23C 22/03 428/457 |

OTHER PUBLICATIONS

U.S. Appl. No. 16/068,247, 'Notice of Allowance', dated Nov. 13, 2019, 7 pages.

* cited by examiner

PRIOR ART

PRINTED CIRCUIT SURFACE FINISH, METHOD OF USE, AND ASSEMBLIES MADE THEREFROM

CROSS-RELATED APPLICATIONS

This application is a continuation of U.S. patent application Ser. No. 16/068,247, which was filed on Jul. 5, 2018, entitled "PRINTED CIRCUIT SURFACE FINISH, METHOD OF USE, AND ASSEMBLIES MADE THEREFROM", which is a 371 U.S. National Phase of PCT International Application PCT/US/2017/012777, which was filed on Jan. 9, 2017, entitled PRINTED CIRCUIT SURFACE FINISH, METHOD OF USE, AND ASSEMBLIES MADE THEREFROM, which claims priority to U.S. Provisional Patent Application No. 62/276,486, which was filed on Jan. 8, 2016. The contents of each of the aforementioned applications are hereby incorporated by reference for all purposes.

FIELD

This disclosure generally relates to a printed circuit surface finish, method of use, and assemblies made therefrom.

BACKGROUND

Surface finishes are applied over copper conductor layers of printed circuit boards (PCB). A patterned surface finish may act as a mask to protect a selected pattern of copper conductor on a substrate during etching of the copper. The surface finish can also reduce or eliminate corrosion of the copper surface to ensure suitable surface chemistry for the application of and reaction with solder for making electrical and physical bonds with electrical components.

Additionally, some surface finishes are especially good at providing a smooth surface. A smooth surface is especially important for mounting high-density components in high value products such as cell phones, tablets, and laptop computers. One currently available surface finish that is especially attractive for high density component mounting is Electroless Nickel/Immersion Gold, commonly referred to as ENIG.

Unfortunately, ENIG has a drawback in that it is prone to forming brittle solder joints. In some cases, a condition referred to as "black pads" has been found to correspond to brittle solder joints. Brittle solder joints can fail (especially under vibration and/or shock load) and lead to malfunction and failure of the electronic assembly and the product in which the electronic assembly operates.

FIG. 1 is a (not to scale) side sectional diagram of an ENIG surface treatment, according to the prior art. As may be appreciated, while one principal benefit of ENIG is intended to be smoothness of the surface, deep intergranular boundaries 112 in the electroless nickel 106 tend to cause openings in the gold layer 110 and a surface roughness that may be less than ideal.

SUMMARY

Embodiments are directed to a nickel-barrier layer-gold (NBG) circuit surface finish observed to reduce corrosion-related issues compared to a conventional electroless nickel-immersion gold (ENIG) surface finish. The NBG surface finish was observed to reduce "black pad" defects, known to affect ENIG. Experimental results indicate the inventor has achieved solder joints exhibiting improved robustness. Inventor contemplates NBG chemistry and process will likely provide for better reliability of electronic assemblies. Inventor contemplates the NBG surface chemistry enables portable electronic devices having improved shock and vibration capabilities.

According to an embodiment, a barrier layer portion of a NBG surface finish includes all or a portion of a reactive nitrogen-containing molecule, deposited onto the surface of a nickel layer prior to application of a thin gold layer. In various embodiments, the nitrogen-containing molecule can include primary, secondary, or tertiary nitrogen(s) covalently bound to carbon. The nitrogen may be present as a substituted aliphatic hydrocarbon or a substituted aromatic hydrocarbon. According to embodiments, nitrogen can include a substituted siloxane with the nitrogen covalently bound to silicon or with a nitrogen covalently bound to a carbon group which is covalently bound to silicon.

According to an embodiment, a surface finish includes a barrier layer including an electroless nickel layer over copper, and a barrier layer disposed over the electroless nickel layer, the barrier layer including an amine or amine fragment deposited on the surface of the electroless nickel. According to an embodiment, electroplated nickel may be substituted for electroless nickel.

According to an embodiment, a NBG surface finish is applied to a conventional printed circuit board such as copper over fiberglass-reinforced epoxy (e.g., FR4) or copper over polyimide.

According to another embodiment, the NBG surface finish is applied to an aluminum conductor of a semiconductor integrated circuit.

According to an embodiment the barrier layer is deposited onto the nickel layer by chemisorption from an aqueous solvent.

According to another embodiment, the barrier layer is deposited onto the nickel layer by condensation of a nitrogen-containing molecule from a vapor such as a butane vapor.

According to an embodiment, an electronic device includes an electrical circuit assembly including NBG surface finish. The electronic device can exhibit improved shock and/or vibration tolerance compared to use of other surface finishes.

According to an embodiment, a method for making an electrical circuit includes applying a NBG surface finish.

According to an embodiment, a composition of matter includes a barrier solution.

According to an embodiment, a composition of matter includes a solder joint having a more tightly contained intermetallic layer than a conventional ENIG-based solder joint.

According to embodiments, an electronic assembly, radio assembly, optical assembly, or satellite or spacecraft subassembly may include NBG conductors or solder joints made with NBG surface chemistry.

According to an embodiment, a PCB surface finish includes a barrier layer including a nitrogen-containing molecule over nickel. The nickel is disposed on an underlying metal. The underlying metal may include copper or aluminum, for example.

DETAILED DESCRIPTION

Figure 1:
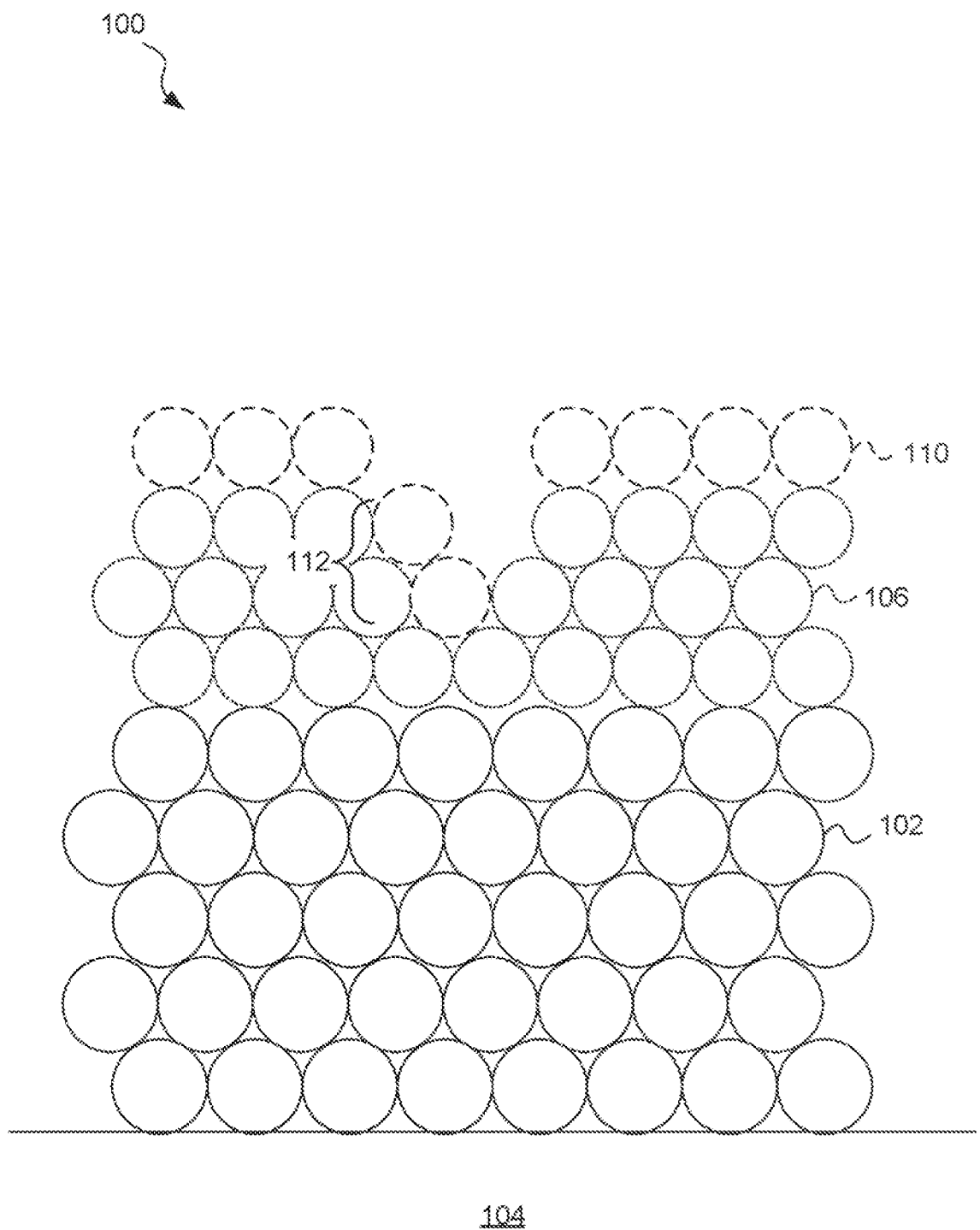
FIG. 1 is a (not-to-scale) side sectional depiction of an electroless nickel-barrier layer-gold ENIG surface treatment, according to the prior art.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Surface finishes provide a barrier between copper pads of the PCB and solder used to make electrical and physical contact with assembled surface mount components. The surface finish can reduce diffusion of copper into the solder during reflow, thereby reducing degradation in physical strength of the solder joint. Various types of surface finishes ensure the reliability of PCB-to-surface mount component physical and electrical continuity at the solder joints, which is critical to an electronic device's reliable operation over time.

One principal benefit of ENIG relates to the role of its nickel layer, which acts as barrier layer to diffusion of underlying copper into the solder joint. The ENIG process includes application of an electroless nickel, followed by forming an immersion gold layer over the electroless nickel. The immersion gold layer provides a protective barrier for passivation of the nickel surface. During the reflow soldering process, the gold layer is dissolved into molten solder and the resultant intermetallic structure forms a bond between electroless nickel atoms and the solder.

According to embodiments, the conventional portions of an ENIG surface finish are augmented by provision of a barrier layer interposed between the electroless nickel and the gold. The barrier layer includes one or more reactive nitrogen-containing molecules.

As used herein, the term "electroless nickel" refers to phosphorous-doped nickel, or alternatively, boron-doped nickel.

As used herein, the phrase reactive nitrogen-containing molecule refers to a molecule that contains nitrogen and which has the capability of reacting with a nickel surface to adhere at least a nitrogen-containing portion of the molecule to the nickel surface.

The inventor discovered a root cause of black pad defects in an Electroless Nickel/Immersion Gold (ENIG) surface finish on a printed circuit board (PCB). The inventor describes the phenomenon as hyper corrosion activity during an immersion gold deposition process on the nickel surface.

Embodiments of the barrier layer described herein were found to reduce concentration of deposits of phosphorous-rich regions in the reflowed solder joint. The reduction in phosphorous-rich regions is associated with higher solder joint ductility and reduced tendency toward brittle failure. The inventor contemplates the NBG surface finish may reduce or eliminate corrosion-related issues (e.g., black pad defects as well as micro-defects similar to black pad but which may be invisible to the naked eye) and provide for robust solder joints for better reliability, including improved shock and vibration resistance, of electronic assemblies and the products in which the assemblies function, compared to use of the ENIG surface chemistry.

Figure 2:
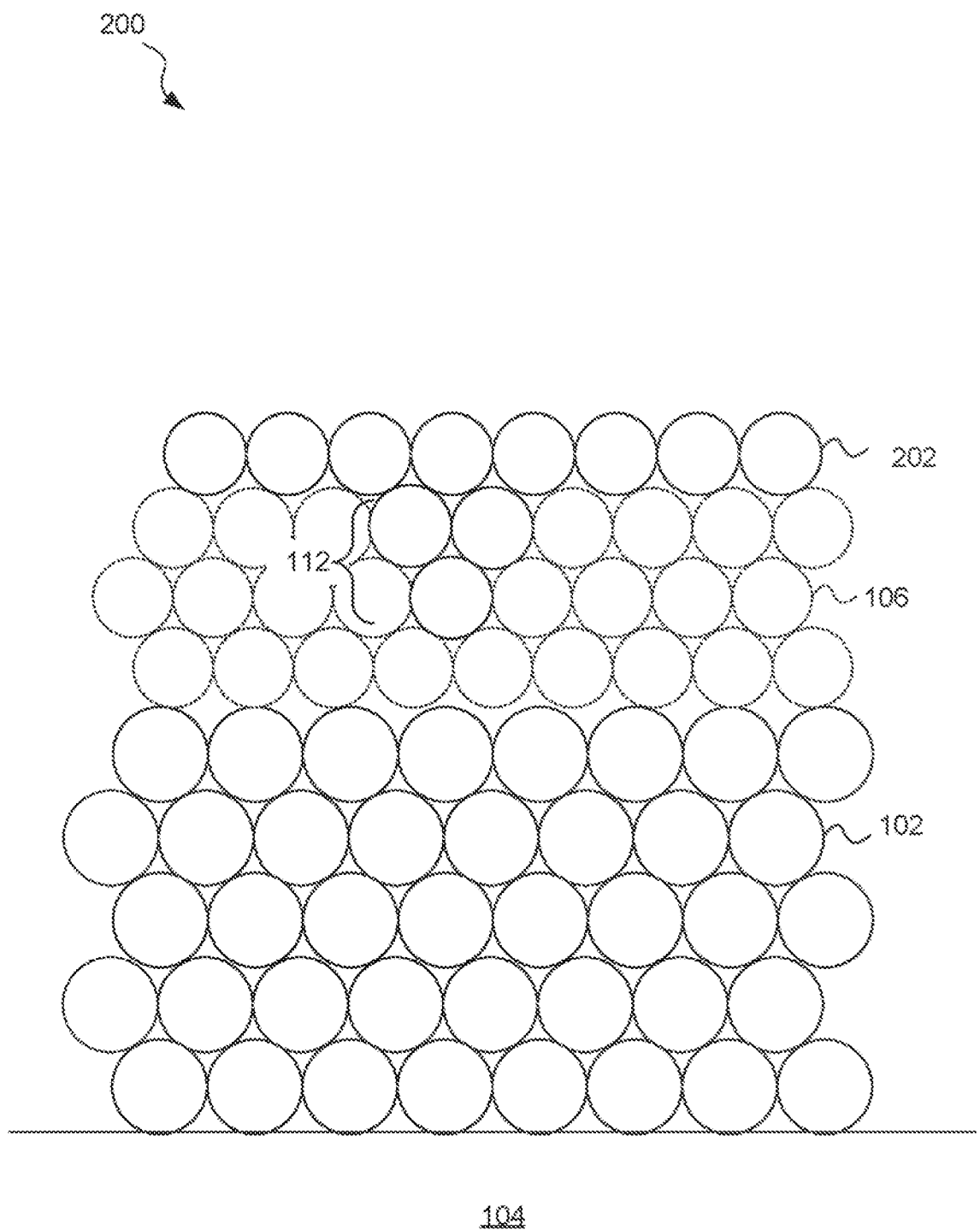
FIG. 2 is a (not-to-scale) side sectional depiction of a barrier layer-on nickel (BLON) surface treatment, according to an embodiment.

FIG. 2 is an idealized side sectional diagram of a barrier layer-on nickel (BLON) surface treatment, according to an embodiment. A metal (M) layer 102 is supported by a substrate 104. In one example, the substrate is a fiberglass-reinforced epoxy such as FR4 and the metal M is copper (Cu). The copper may be between about 10 and 100 micrometers thick. In another example, the substrate is a semiconductor such as single crystal silicon (Si), glass, or semiconductor-on-glass and the metal M is aluminum (Al).

A nickel (Ni) layer 106 is disposed on the surface of the metal M. The nickel layer may typically be electroless nickel, which includes a phosphorous (P) or boron (B) component. In a conventional phosphorous-doped electroless nickel, the phosphorous content may typically be 8-9 wt %. The nickel layer 106 may typically be about 3-6 micrometers thick.

A barrier layer 108 includes a separately deposited nitrogen-containing molecule or molecular fragment on the nickel 106 surface. The barrier layer 108 is understood to generally be deposited to a depth of only one or a few atoms thick.

Figure 3:
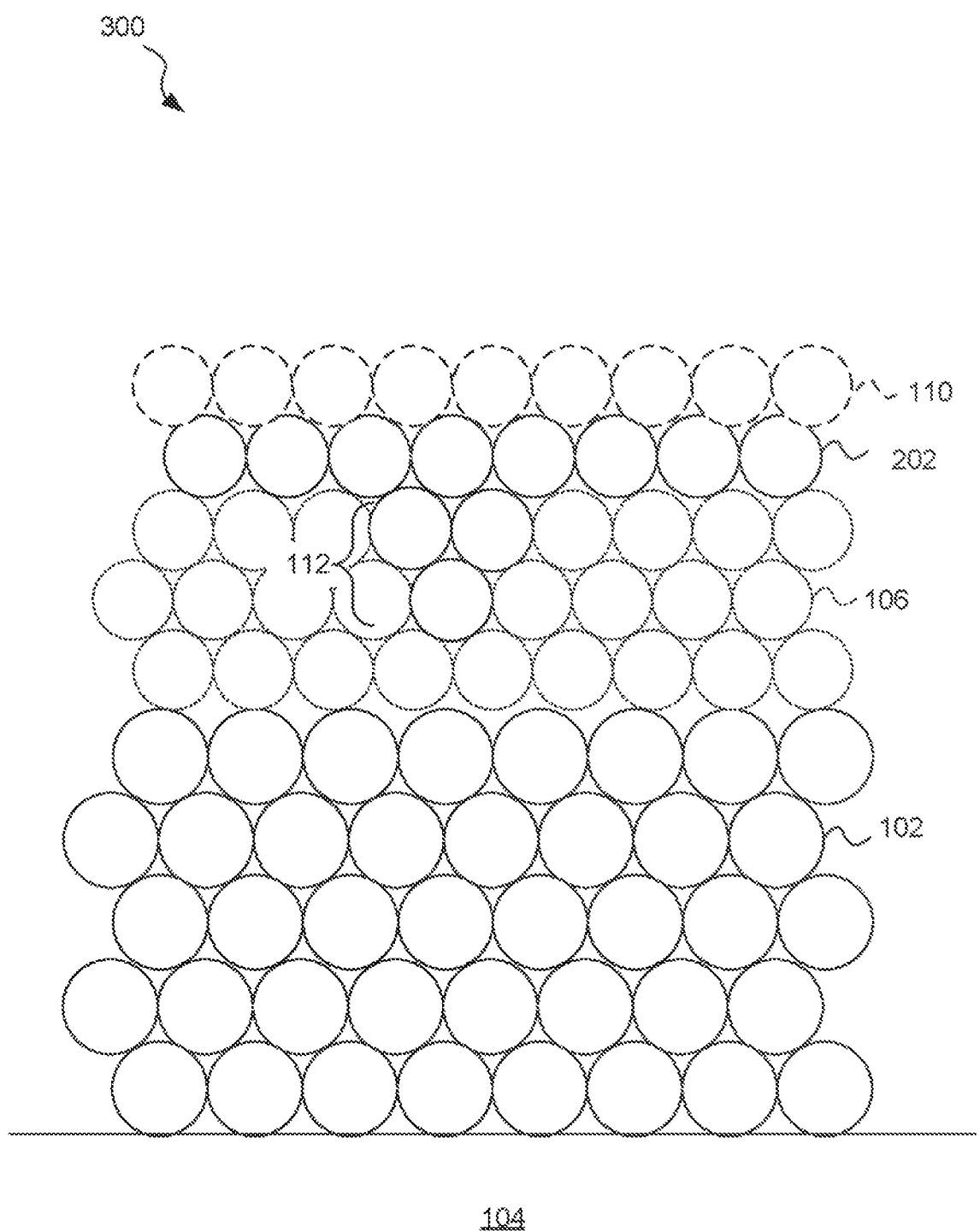
FIG. 3 is a (not-to-scale) side sectional depiction of a nickel-barrier layer-gold (NBG) surface treatment, according to an embodiment.

FIG. 3 is an idealized side sectional diagram of a nickel-barrier layer-gold (NBG) surface treatment, according to an embodiment. A metal (M) layer 102 is supported by a substrate 104. In one example, the substrate is a fiberglass-reinforced epoxy such as FR4 and the metal M is copper (Cu). The copper may be between about 10 and 100 micrometers thick. In another example, the substrate is a semiconductor such as single crystal silicon (Si), glass, or semiconductor-on-glass and the metal M is aluminum (Al).

A nickel (Ni) layer 106 is disposed on the surface of the metal M. The nickel layer may typically be electroless nickel, which includes a phosphorous (P) or boron (B) component. In a conventional phosphorous-doped electroless nickel, the phosphorous content may typically be 8-9 wt %. The nickel layer 106 may typically be about 3-6 micrometers thick.

A barrier layer 108 includes a separately deposited nitrogen-containing molecule or molecular fragment on the nickel 106 surface. The barrier layer 108 is understood to generally be deposited to a depth of only one or a few atoms thick. A gold layer 110 may be deposited over the nickel layer 106 and barrier layer 108. According to embodiments, the gold layer is deposited by immersion coating, which results in a depth of only one or a few atoms.

A barrier layer 108 includes a separately deposited nitrogen-containing molecule or molecular fragment on the nickel 106 surface. The barrier layer 108 is understood to generally be deposited to a depth of only one or a few atoms thick.

According to embodiments, amine groups chemisorb to nickel atoms situated at intergranular boundaries (deep crevices) 112 to make the microstructure smoother. The smoothed microstructure is contemplated to reduce galvanic hyper-corrosion during subsequent application of an immersion gold layer 110. The reduction in hyper-corrosion is contemplated to reduce a tendency for copper migration from the copper layer 102, reduce coating porosity, and reduce a risk of degradation of solderability compared to a conventional ENIG surface treatment.

The barrier layer 108 is understood to passivate the atoms of the nickel layer 106 at the surface and at the intergranular boundaries 112 and deep crevices of the nickel layer 106. The barrier layer 108 may be deposited by chemisorption of amine with resultant smoothening of the microstructure.

According to inventors' hypothesis, in the presence of the nickel surface, amine molecules may dissociate into a NH-anionic species. Chemisorption of amine at the intergranular boundaries 112 and smoothening of the microstructure reduces or eliminates galvanic hyper corrosion (aka "black pads") and achieves robust solder joints. As a result, brittle failure of the solder joint and/or component fall-offs in the electronic assemblies may be reduced or eliminated, leading to improved reliability of electronic devices made according to the disclosure herein.

Embodiments include an electroless nickel layer having a phosphorous content of 8-9 wt %. The inventor(s) contemplate that embodiments herein may allow a reduction in P content in the electroless nickel layer. The inventor(s) further contemplate that a low concentration of additional metals including zinc and/or tin may be included in the electroless nickel layer, which metals may interact synergistically with embodiments herein to yield one or more improved properties including improved shock resistance, yield, traceability, vibration, joint shear strength, and/or joint ductility.

Figure 4:
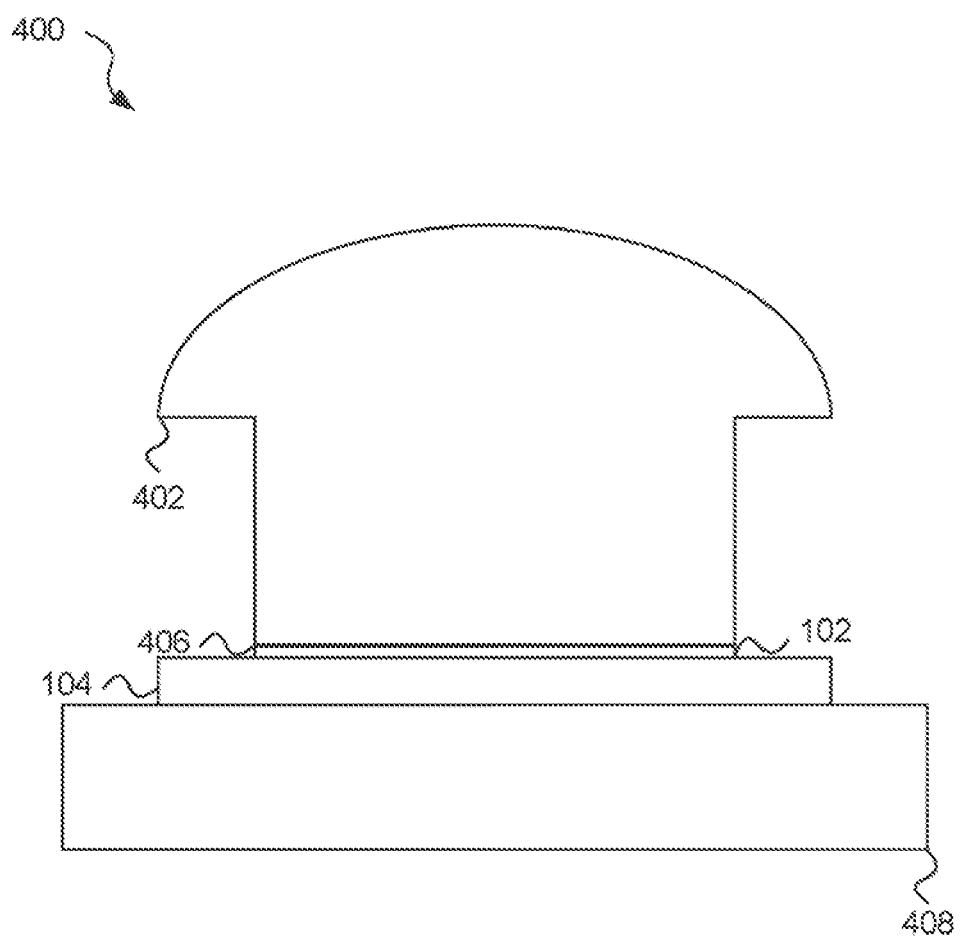
FIG. 4 is a (not to scale) sectional diagram of a solder joint over a copper pad made using an NBG surface finish, according to an embodiment.

FIG. 4 is a side sectional diagram of an assembly including a solder ball 402 over the nickel 106. An intermetallic layer 406 lies between the solder 402 and the nickel layer 106. The nickel layer is disposed, a copper pad 20 and a dielectric substrate 18, according to an embodiment. Referring to FIGS. 1 and 2, during a solder reflow process, the gold layer 16 is dissolved into the solder, and the intermetallic layer 22 is formed between the electroless nickel layer 12 and the solder 24. The composition of the intermetallics include solder (tin alloy), electroless nickel, and carbon. The intermetallic layer causes the solder joint to exhibit desired ductility and to resist brittle failures.

Figure 5:
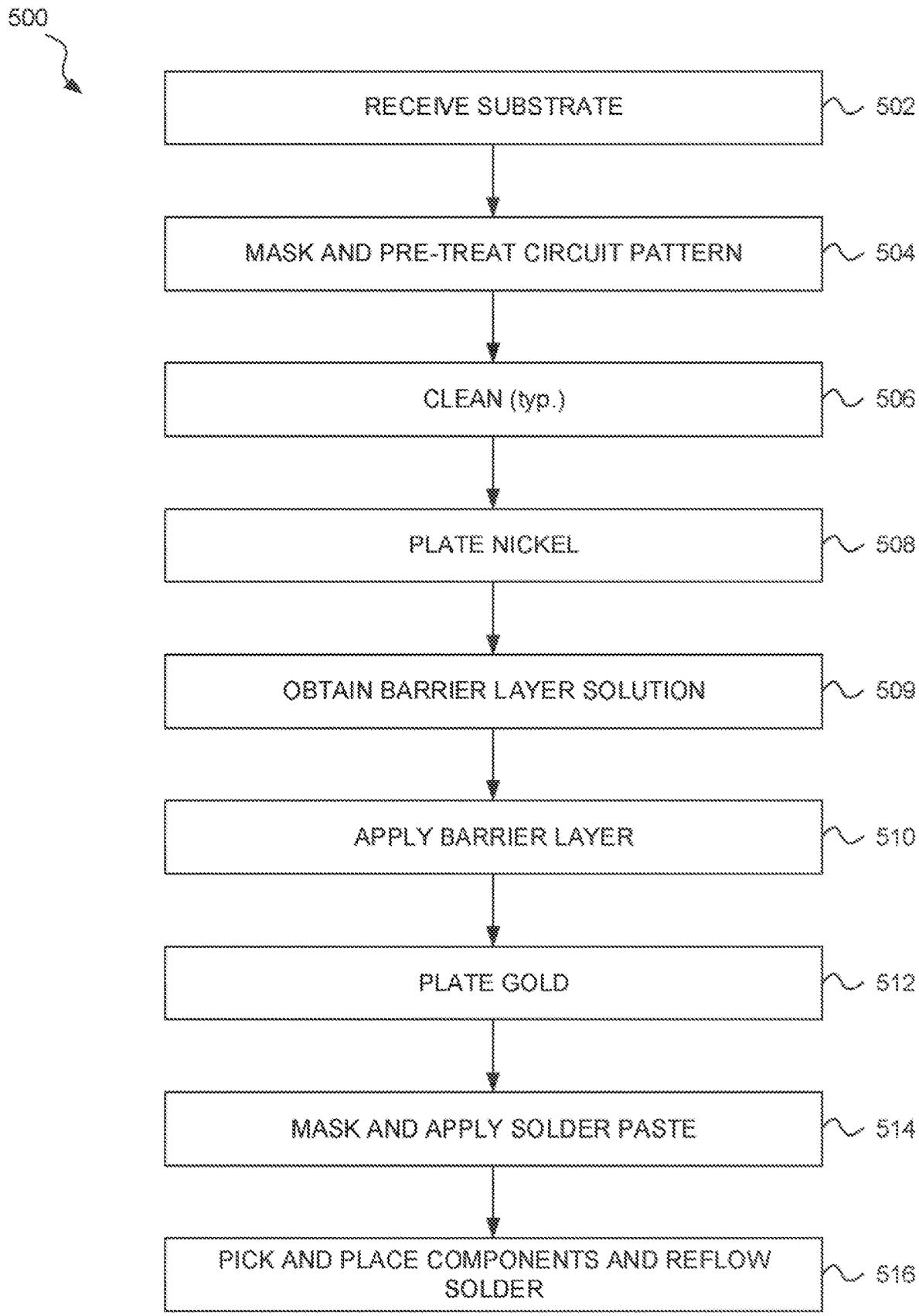
FIG. 5 is a flow chart showing a process for making a NBG surface finish and/or an electronic assembly including solder joints made from a NBG surface finish, according to an embodiment.

FIG. 5 is a flow chart showing a method 500 for making a circuit assembly including an NBG surface finish, according to an embodiment. Beginning at step 502, a substrate is received, at least a portion of the surface of the substrate including a conductive material layer. In an embodiment, a substrate can include a dielectric layer, such as fiberglass reinforced epoxy (FR4) or polyimide, having a conductor, such as copper (Cu), on at least one surface. For purposes of description, it is assumed that the received substrate has been cleaned, such as by mechanical abrasion followed by a solvent wash, and dried. In another embodiment, the substrate includes a semiconductor, such as a silicon wafer, with a conductor, such as aluminum (Al), on the surface.

Proceeding to step 504, a mask is applied to the surface of the circuit substrate and particularly the conductor. The mask is selected (e.g., designed or laid out) to define individual electrical conductors. Following application of the mask, the exposed surface of the conductor may be pre-treated. Pre-treatment can include dipping, spin coating, spraying, or otherwise applying a material selected to attract or receive at least nickel atoms during a subsequent step 508.

For example, pre-treatment of a copper conductor can include immersion coating palladium (Pd) from a solution into a thin layer on the surface of the conductor. An example procedure includes the following steps:

1. Use compressed air to remove dust and metal particles from component.
2. Immerse component in acetone bath for 60 seconds.
3. Upon removal immediately immerse in 70% isopropyl alcohol solution for 15 seconds.
4. Rinse off isopropyl alcohol under running water.
5. Immerse component in deionized (DI) water bath and sonicate for 180 seconds.
6. Remove component from DI water bath and remove excess water with compressed air until no water droplets remain.
7. Immerse component in 17.5% nitric acid solution for 60 seconds.
8. Immerse component in 5% sulfuric acid solution for 30 seconds.
9. Remove component from 5% sulfuric acid solution and rinse under running DI water.
10. Immerse component in DI water bath and sonicate for 180 seconds.
11. Remove component from DI water bath and dry thoroughly with compressed air.
12. Immediately cover component completely with lint-free cloth until ready to proceed with activation and plating steps.
13. Using palladium-based solution (0.1 g/LPdCb, 1 ml/L HCl (37% concentrate)) (Use in concentration as supplied) (Use at room temperature), briefly immerse the component in a bath containing Pd solution. The component should only be immersed very briefly, for 2 seconds or less and removed immediately.
14. Upon removal, immediately immerse component in a bath of DI water, agitate component in bath for 10 seconds to remove bulk of remaining Pd solution from surface of component.
15. Remove component from bath and rinse thoroughly using a jet of water under pressure, going over every part of component in detail.
16. Repeat this thorough rinsing. Thorough rinsing is crucial. No residue should remain on the component surface.

In another example, pre-treatment of an aluminum conductor can include immersion coating zinc (Zn) from a zincate solution onto a thin layer on the surface of the conductor. Immersion coating is an atomic substitution of a more noble metal atom for a less noble metal atom, in which plating thickness is limited by steric availability of the less noble metal atom at the surface. The presence of Pd or Zn on the surface defines a conductor area with a higher affinity for a subsequently plated metal compared to an area without the presence of the material. As used herein, the material (e.g. Pd or Zn) coated onto the conductor may be referred to as an activator.

Proceeding to step 506, the substrate may be cleaned to remove the mask. Step 506 is a typical step in that cleaning may typically occur between steps shown in the method 300. In the interest of clarity, description of specific cleaning processes between specific steps is omitted. Cleaning may include one or more of an acid wash, a basic wash, mechanical abrasion, sonication, a solvent wash, UV exposure, heat exposure, etc., followed by rinsing and drying.

Proceeding to step 508, nickel is plated onto the areas of the conductor surface coated with the pre-treatment material. Accordingly, the nickel is applied onto the electrical conductor areas defined by the mask. The nickel (with dopant, if electroless) may be applied to a thickness of about 3-6 micrometers, for example.

According to an embodiment, applying the nickel includes applying electroless nickel to the activator applied to the conductive material. In another embodiment, nickel may be electroplated onto the conductor. The nickel may be electroplated through the mask, for example. In cases where electroplating is used, step 504 may consist essentially of applying the mask, and the pre-treatment portion of step 504 may be omitted.

Electroless nickel typically includes a dopant that cooperates with the nickel to self-catalyze the coating process. In some embodiments, the dopant includes boron (B). In some embodiments, the dopant includes phosphorous (P). A phosphorous-doped electroless nickel may be applied using NiSQ4 chemistry by holding the substrate in a water solution including (NiSQ4*6H20) in a range of 20-40 g/L, sodium hypophosphite in a range of 20-30 g/L, sodium citrate in a range of 15-25 g/L, and thiourea in a range of 1-5 mg/L.

In step 509, a water solution carrying a reactive nitrogen-containing molecule is obtained. Step 509 may include purchasing the solution or may include making the solution.

In an embodiment, making the water solution of the reactive nitrogen-containing molecule in step 509 may include making a solution, in deionized water, of an aromatic amine. In another embodiment, making the water solution of the reactive nitrogen-containing molecule in step 509 may include making a water solution of an aliphatic amine. Making a water solution of an aliphatic amine may include making a solution of 0.1 to 1 molar 1,4 diamine butane or making a solution of 0.1 to 1 molar diethylene tri-amine. Making a water solution of a reactive nitrogen-containing molecule may include making a water solution of ammonium hydroxide. In another embodiment, making a water solution of a reactive nitrogen-containing molecule includes making a water solution of an amine-substituted siloxane. Making the water solution of the reactive nitrogen-containing molecule in step 509 may include adjusting the pH to about 12.

Ammonium hydroxide may be used to adjust the pH.

For embodiments where a less soluble nitrogen-containing molecule is used, making the water solution in step 509 may include adding an emulsifier and/or a detergent to the water.

The reactive, nitrogen-containing molecule(s) may include one or more of: R1-NH2, NH2-R1-NH2, NH2-R1-NH2 NH2, NH2-R1-NH2-R2-NH2, R1-N—R2H, R1-N—R2R3, A1-NH2, NH2-A1-NH2, NH2-A1-NH2NH2, A1-N-A2H, A1-N-A2A3, A1-N—R1H, A1-N-A2R1, A1-N—R1R2, a NH2-substituted siloxane, and an amine-substituted siloxane; where R1 is a first substituted or unsubstituted aliphatic group of C18 or less; where R2 is a second substituted or unsubstituted aliphatic group of C18 or less where R3 is a third substituted or unsubstituted aliphatic group of C18 or less; where A1 is a substituted or unsubstituted aromatic group; and where A2 is a second substituted or unsubstituted aromatic group of C18 or less; where A3 is a third substituted or unsubstituted aromatic group of C18 or less.

In an embodiment, the reactive nitrogen-containing molecule includes 1 to 6 carbon atoms. In another embodiment, the nitrogen-containing molecule includes 3 to 5 carbon atoms. In an embodiment, the nitrogen-containing molecule includes 1,4 diamine butane. In an embodiment, the nitrogen-containing molecule includes diethylene triamine.

Proceeding to step 510, a barrier layer is applied onto the nickel, the barrier layer including at least a portion of a reactive nitrogen-containing molecule. In an embodiment, steps 509 and 510 may include making a water solution of a reactive nitrogen-containing molecule and exposing the water solution of the reactive nitrogen-containing molecule to the nickel. Applying the barrier layer to the nickel may include maintaining the temperature of the water solution at 30-80° C. while exposing the water solution of the reactive nitrogen-containing molecule to the nickel for 5-40 minutes.

In an alternative embodiment, applying the barrier layer to the nickel can include dissolving the reactive nitrogen-containing molecule in a vapor and condensing the nitrogen-containing molecule out of the vapor onto the nickel. For example, a molecule such as 1,4 diamine butane may be carried by a butane vapor and may be condensed onto the nickel therefrom.

According to another embodiment, the barrier layer is deposited onto the nickel layer from a high molecular weight matrix by adhesion of a solid or viscous liquid layer such as a polyester-supported polymethyl methacrylate host polymer carrying a nitrogen-containing molecule guest, followed by peeling away of the polyester (optionally, aided by application of heat).

In an alternative embodiment, applying the barrier layer to the nickel may include embedding the reactive nitrogen-containing molecule in a polymer matrix supported by a transfer film, placing polymer matrix side of the transfer film in close proximity to the nickel surface, and applying heat to the transfer film to cause the nitrogen-containing molecule to diffuse out of the polymer matrix and condense on the nickel.

Optionally, the method 500 may include step 512, wherein a layer of gold is applied over the barrier layer, such that the individual electrical conductor have a nickel-barrier layer-gold (NBG) surface treatment over the conductive material. In one embodiment, gold is immersion coated onto the nickel and the barrier layer disposed thereon. In another embodiment, gold is electroplated over the nickel and the barrier layer disposed thereon.

Proceeding to step 514, areas of the exposed conductive material not carrying the applied nickel and barrier layer are etched to form individual electrical conductors. In one embodiment where gold is applied to the barrier layer, etching is performed prior to applying the layer of gold. In another embodiment, etching is performed after applying the layer of gold.

Proceeding to optional step 516, a pattern of solder paste may be applied over the electrical conductors (including the conductive layer, nickel, barrier layer, and optionally gold), the pattern of solder paste corresponding to component mounting pads, and a plurality of surface mount components may be picked and placed onto the component mounting pads. The solder paste may be reflowed to make respective solder joints between the electrical conductors and the surface mount components to form an electrical circuit, and the electrical circuit cooled and cleaned.

The solder joints made according to the method 500 (NBG chemistry) were characterized by a reduction in areas with high phosphorous concentration compared to solder joints made without the barrier layer (ENIG chemistry). The solder joints made according to the method 500 (NBG chemistry) were characterized by more confined regions of intermetallics compared to solder joints made without the barrier layer (ENIG chemistry). It is contemplated that the solder joints made according to the method 500 (NBG chemistry) may be characterized by a reduced probability of brittle failure compared to solder joints made without the barrier layer (ENIG chemistry).

Figure 6:
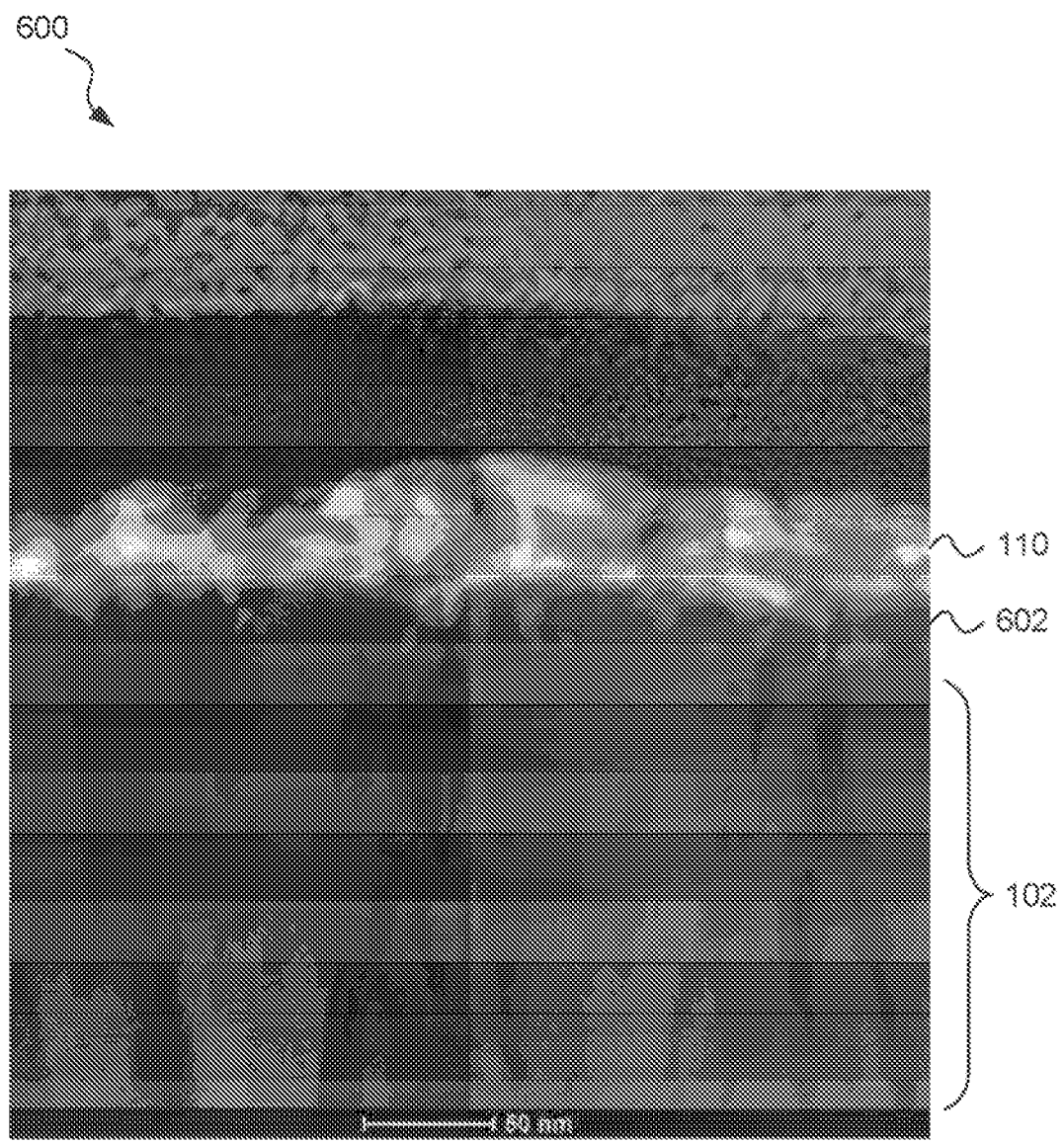
FIG. 6 is a transmission electron microscope image 600 of a sectioned NBG surface treatment, according to an embodiment.

FIG. 6 is a transmission electro micrograph 600 of a sectioned NBG surface treatment, according to an embodiment. Of particular importance is the continuous gold layer 110. The thickness of the gold layer is about 50 nanometers. (In comparison, the gold layer in a similar image of a conventional ENIG surface treatment shows the gold layer discontinuous with sections displaced vertically from one another.) A thin intermetallic region 602 lies immediately below the gold layer 110. The electroless nickel layer 106 extends to the bottom of the image.

FIG. 6 represents a composition of matter including an Electroless Nickel (Ni—P)-Barrier Layer-Gold (Au) surface treatment lying superjacent a conductor layer comprising at least one additional metal, according to an embodiment. The at least one additional metal may include copper and/or aluminum.

The surface treatment is expressed as a conductive pad structure having increased carbon concentration near its surface relative to an Electroless Nickel Immersion Gold (ENIG) surface finish and a more confined concentration of gold near its surface. The composition of matter exhibits a substantially continuous Au layer, as shown in SEM section. As shown in FIG. 6, the composition of matter may further include a continuous intermetallic layer between the Au and Ni—P.

According to an embodiment, the barrier layer is deposited from a water solution carrying at least one reactive, nitrogen-containing molecule. The water solution from which the barrier layer is deposited may further include ammonium hydroxide and may be pH-balanced to about 12. In some embodiments, the water solution includes an emulsifier.

According to an embodiment, the barrier layer is deposited from a water solution carrying at least one reactive, nitrogen-containing molecule corresponding to the group consisting of: R1-NH2, NH2-R1-NH2, NH2-R1-NH2, NH2-R1-NH2-R2-NH2, R1-N—R2H, R1-N—R2R3, A1-NH2, NH2-A1-NH2, NH2-A1-NH2 NH2, A1-N-A2H, A1-N-A2A3, A1-N—R1H, A1-N-A2R1, A1-N—R1R2, a NH2-substituted siloxane, and an amine-substituted siloxane; where R1 is a first substituted or unsubstituted aliphatic group of C18 or less; where R2 is a second substituted or unsubstituted aliphatic group of C18 or less; where R3 is a third substituted or unsubstituted aliphatic group of C18 or less; where A1 is a substituted or unsubstituted aromatic group; where A2 is a second substituted or unsubstituted aromatic group; and where A3 is a third substituted or unsubstituted aromatic group.

In some embodiments, the nitrogen-containing molecule includes 1 to 6 carbon atoms, total. In some embodiments, the nitrogen-containing molecule includes 3 to 5 carbon atoms.

The nitrogen-containing molecule includes 1,4 diamine butane, according to an embodiment. In another embodiment, the nitrogen-containing molecule includes diethylene triamine.

Figure 7:
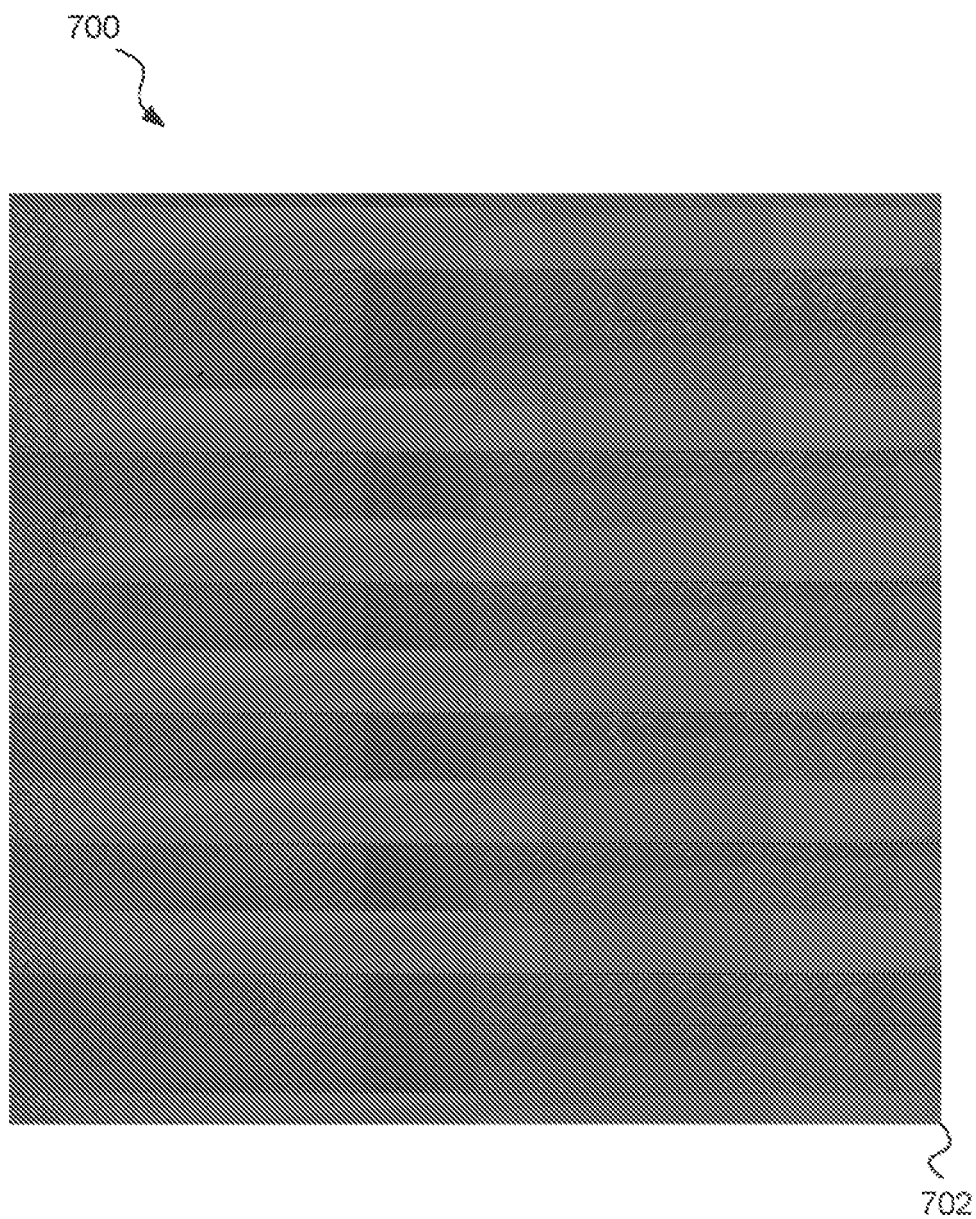
FIG. 7 is a SEM image of a barrier layer surface over electroless nickel, according to an embodiment.
Figure 8:
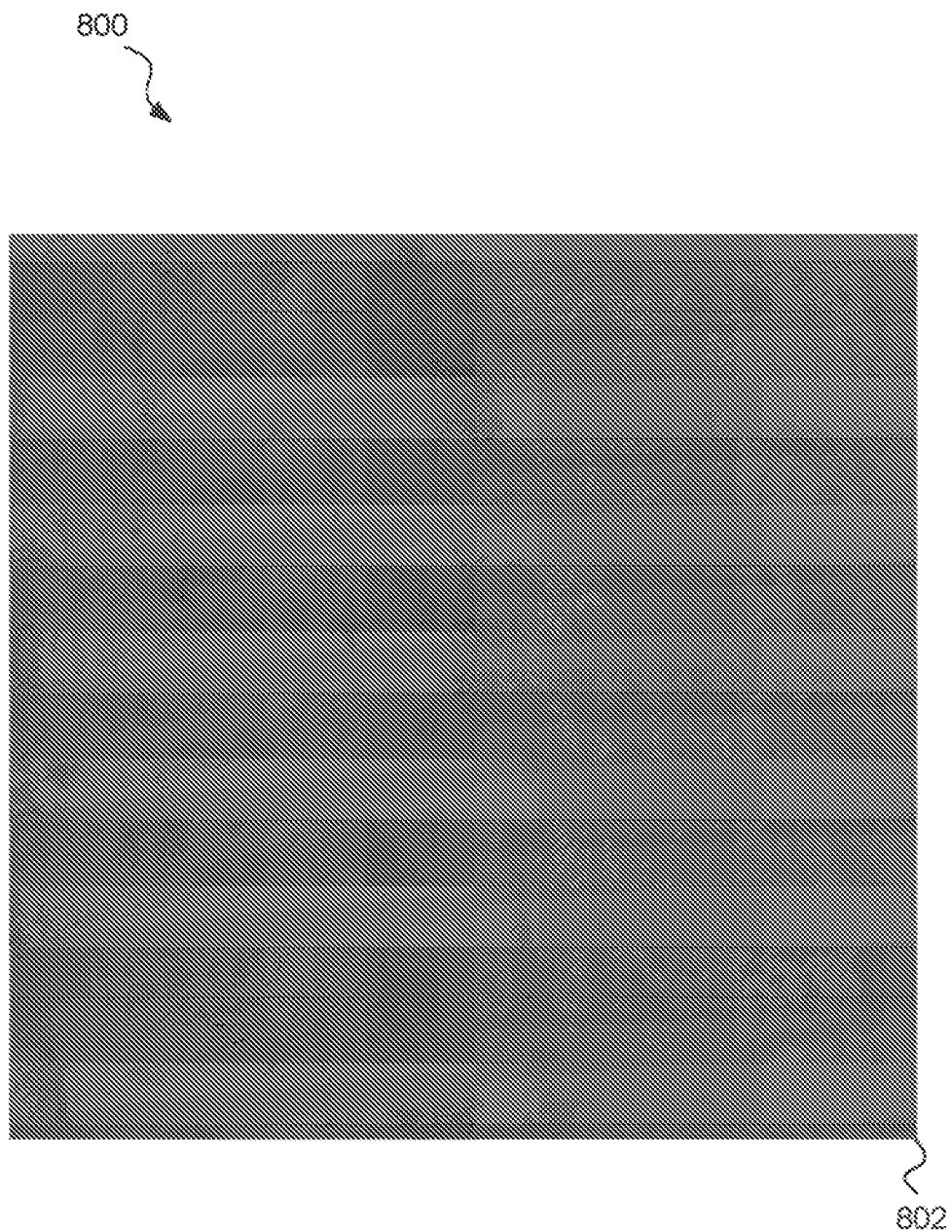
FIG. 8 is a SEM image of the electroless nickel surface at the same magnification as FIG. 7, according to an embodiment.

FIG. 7 is a SEM image of a barrier layer surface over electroless nickel, made according to an embodiment. FIG. 8 is a SEM image of the electroless nickel surface at the same magnification as FIG. 7. By comparison of FIG. 7 to FIG. 8, one can readily see an improvement in surface smoothness caused by the barrier layer.

ENIG surface treatments exhibit a relatively high electroless nickel grain boundary expression, corresponding to a rough surface characterized by electroless nickel patches on the surface of the ENIG electrode. Portions of the rough surface of the electroless nickel lie adjacent or superjacent to an intervening gold monolayer. For comparison, the gold layer in an NBG surface treatment is continuous, as may be seen in FIG. 6.

Figure 9:
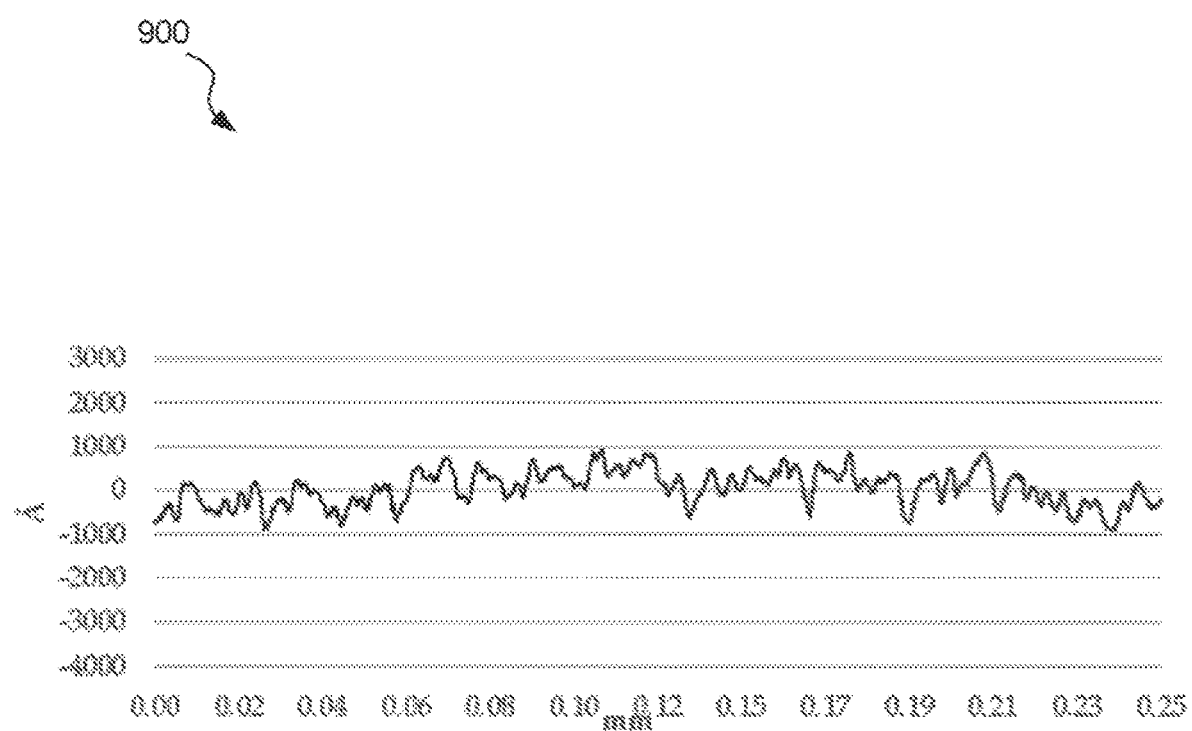
FIG. 9 is a surface profilometer output corresponding to the surface of the barrier layer, according to an embodiment.
Figure 10:
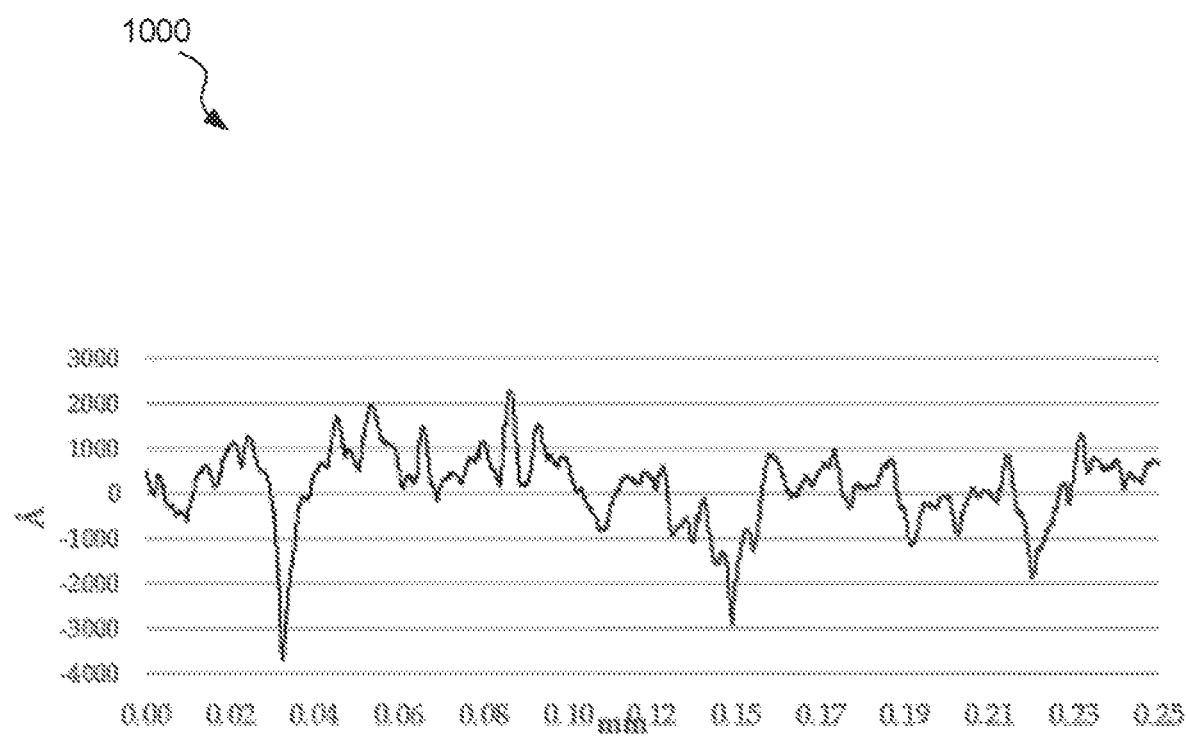
FIG. 10 is a surface profilometer output corresponding to the surface of the electroless nickel layer, according to an embodiment.
Figure 11:
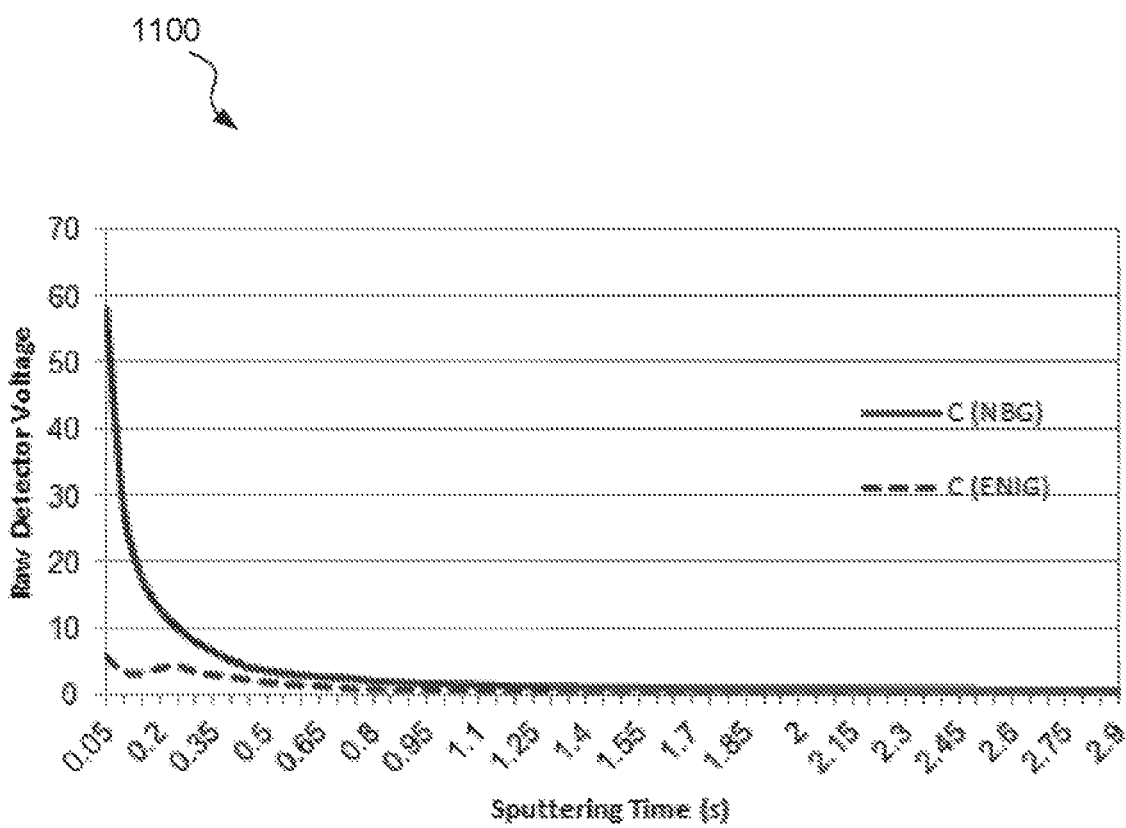
FIGS. 11-14 are glow discharge emission spectrograph (GDOES) graphs, according to an embodiment.
Figure 12:
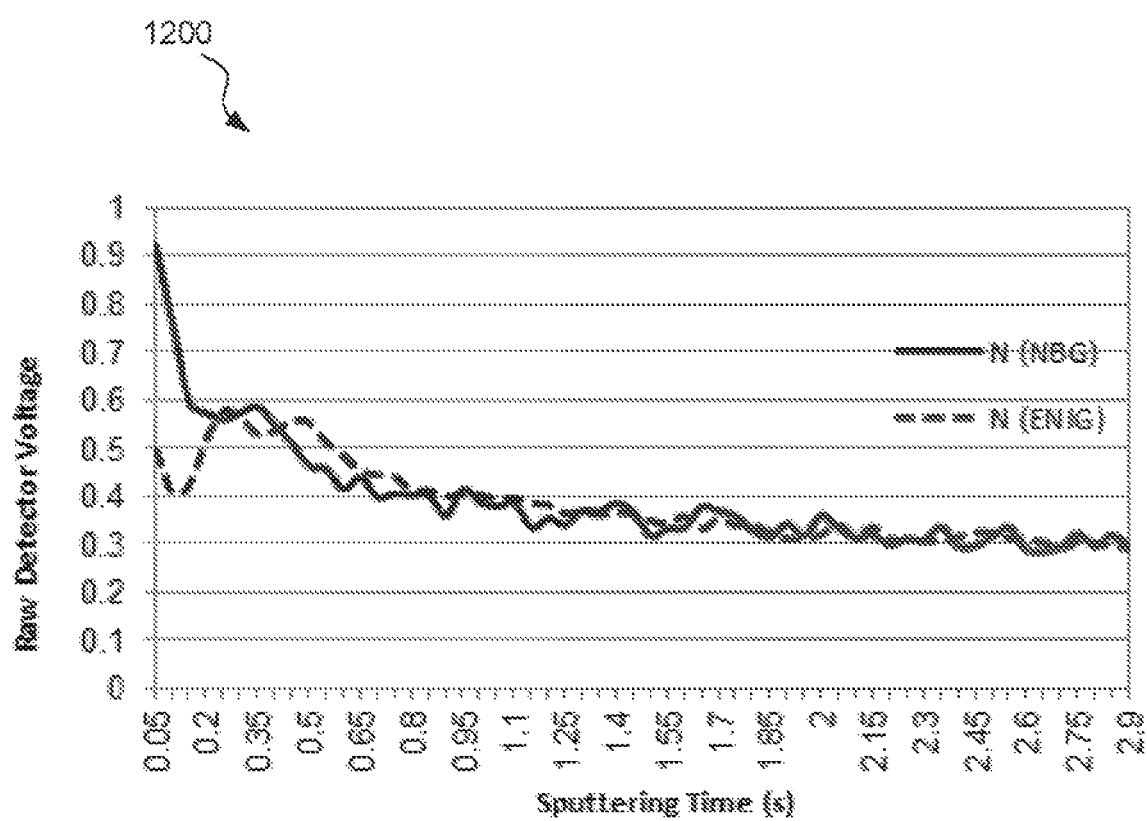
Figure 13:
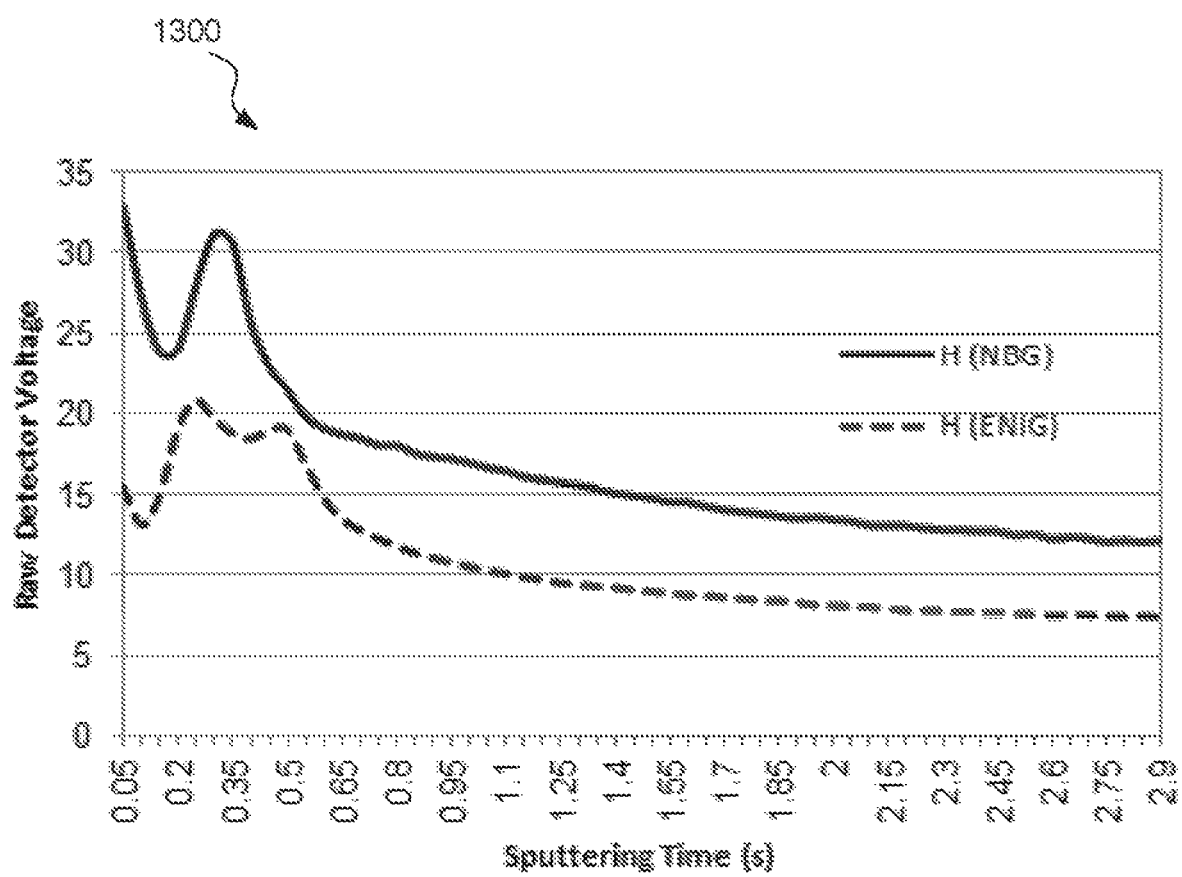
Figure 14:
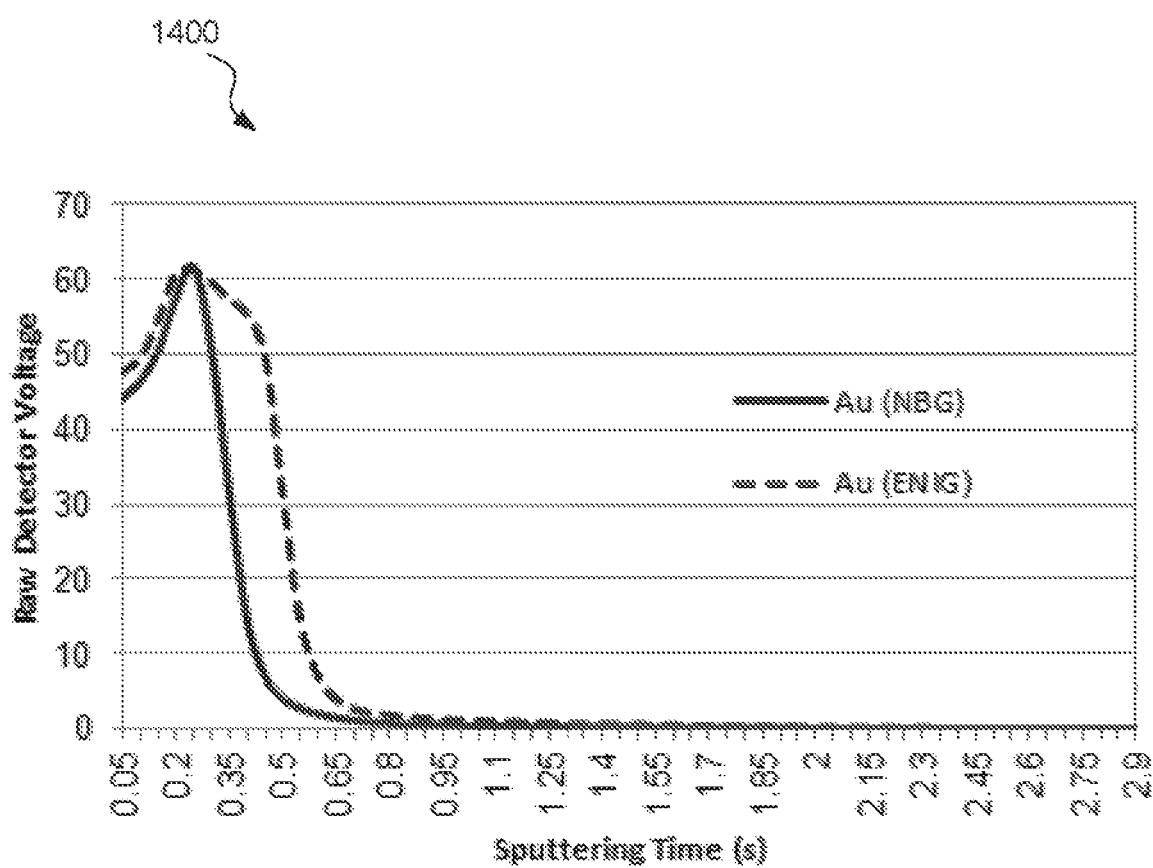

FIG. 9 is a surface profilometer output corresponding to the surface of the barrier layer shown in FIG. 7. FIG. 10 is a surface profilometer output corresponding to the surface of the electroless nickel layer shown in FIG. 8.

Surface profiles were made using the same parameters. FIGS. 9 and 10 make clear the improvement in surface smoothness provided by the barrier layer.

FIGS. 11-14 are glow discharge emission spectrograph (GDOES) graphs corresponding to the concentrations of carbon, nitrogen, oxygen, and gold according to depth below respective surface treatment surfaces. Each graph compares the concentration of a species in an NBG surface treatment compared to a ENIG surface treatment.

Figure 15:
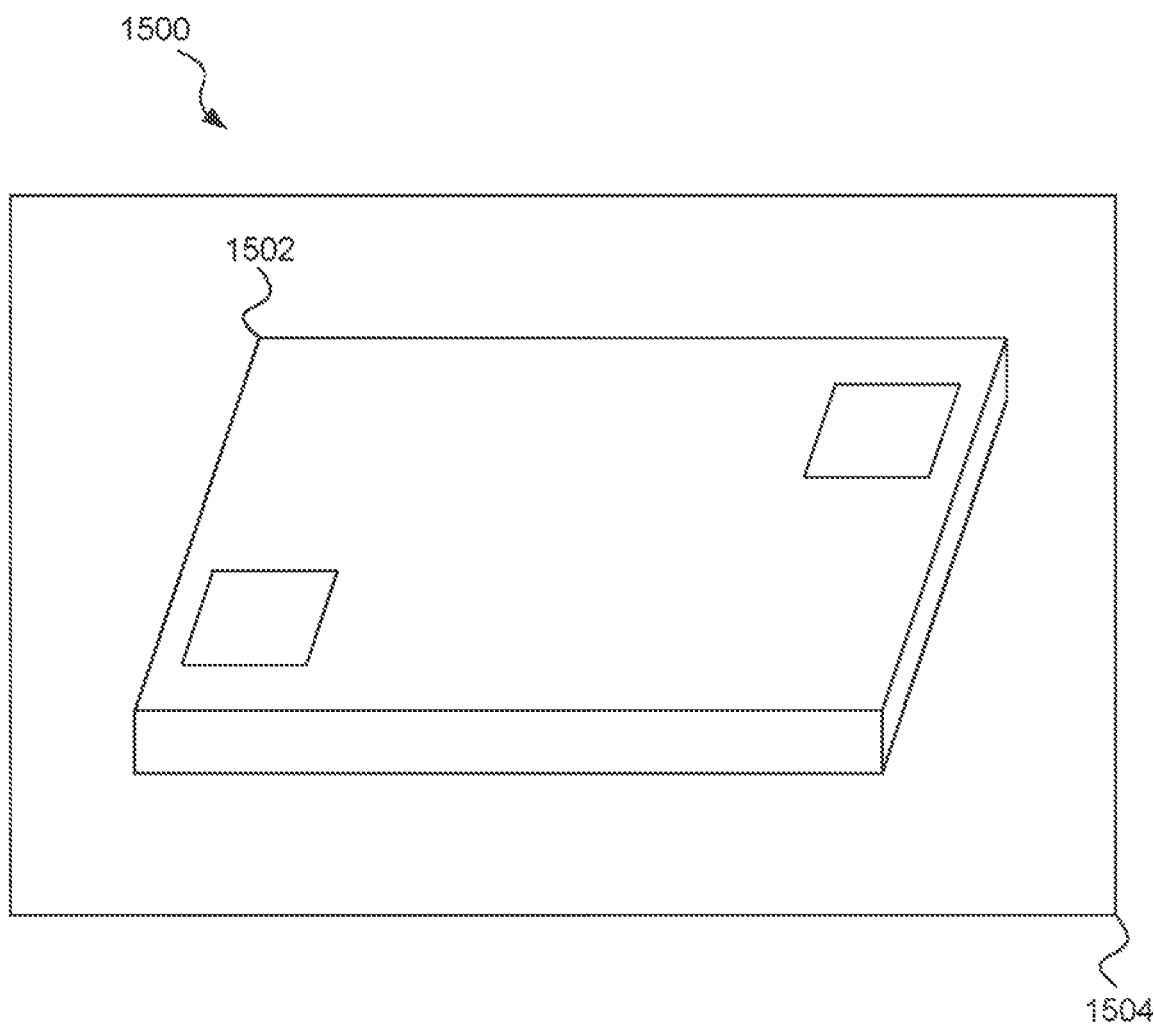
FIG. 15 is a diagram illustrating an NBG surface finish trace, according to an embodiment.

FIG. 15 is a diagram 1500 illustrating an NBG surface finish trace 1502 on an electrical circuit 1504, which is included in an electronic product 1506. The inventors contemplate that the BLON and ENIG surface finishes described herein may significantly improve drop test results for electronic products using them.

While various aspects and embodiments have been disclosed herein, other aspects and embodiments are contemplated. The various aspects and embodiments disclosed herein are for purposes of illustration and are not intended to be limiting, with the true scope and spirit being indicated by the following claims.

The invention claimed is:

1. A method for making an electrical circuit assembly, comprising:
   receiving a substrate, at least a portion of the substrate including a conductive material layer that defines one or more electrical conductors;
   applying nickel onto at least a portion of each of the one or more electrical conductors;
   applying a barrier layer onto the nickel, the barrier layer comprising at least a portion of a nitrogen-containing molecule; and
   applying immersion gold onto the at least a portion of each of the one or more electrical conductors subsequent to the applying the barrier layer.

2. The method of claim 1 wherein the barrier layer is applied using a solution comprising an amine.

3. The method of claim 1 wherein the nitrogen-containing molecule includes from one to six carbon atoms.

4. The method of claim 1 wherein the barrier layer is applied using a solution comprising a diamine or a triamine.

5. The method of claim 1 wherein the barrier layer is applied using a solution comprising diethylene triamine.

6. The method of claim 1 wherein the barrier layer is applied using a solution comprising siloxane.

7. The method of claim 1 wherein the immersion gold is applied using a solution comprising chloroauric acid and choline chloride.

8. A method of plating one or more terminals of a substrate, the method comprising:
- immersing the substrate in a first solution that forms a nickel layer on at least a portion of each of the one or more terminals;
- immersing the substrate in a second solution comprising nitrogen-containing molecules that forms a conversion layer on at least a portion of the nickel layer; and
- immersing the substrate in a third solution that forms a gold layer on at least a portion of an outermost surface of each of the one or more terminals.

9. The method of claim 8 wherein the second solution comprises an amine.

10. The method of claim 8 wherein the nitrogen-containing molecules include from one to six carbon atoms.

11. The method of claim 8 wherein the second solution comprises a diamine or a triamine.

12. The method of claim 8 wherein the second solution comprises siloxane.

13. The method of claim 8 wherein the third solution comprises chloroauric acid and choline chloride.

* * * * *